(12) United States Patent
Tarbell

(10) Patent No.: US 10,477,744 B2
(45) Date of Patent: Nov. 12, 2019

(54) ELECTRICAL DEVICE SHIELD TOOL AND METHOD OF USING SAME

(71) Applicant: Nonconductive Tool Company, LLC, Torrance, CA (US)

(72) Inventor: Warren Tarbell, Torrance, CA (US)

(73) Assignee: NONCONDUCTIVE TOOL COMPANY, LLC, Torrance, CA (US)

( * ) Notice: Subject to any disclaimer, the term of this patent is extended or adjusted under 35 U.S.C. 154(b) by 0 days.

(21) Appl. No.: 15/975,495

(22) Filed: May 9, 2018

(65) Prior Publication Data

US 2018/0332740 A1 Nov. 15, 2018

Related U.S. Application Data

(60) Provisional application No. 62/503,863, filed on May 9, 2017, provisional application No. 62/503,882, filed on May 9, 2017.

(51) Int. Cl.
*H05K 9/00* (2006.01)
*H02H 3/00* (2006.01)

(52) U.S. Cl.
CPC ............ *H05K 9/0079* (2013.01); *H02H 3/00* (2013.01)

(58) Field of Classification Search
CPC .................................................. H05K 9/0079
See application file for complete search history.

(56) References Cited

U.S. PATENT DOCUMENTS

| | | | | | |
|---|---|---|---|---|---|
| 2,092,904 | A | * | 9/1937 | Brugger | H01R 13/62 174/67 |
| 3,729,572 | A | * | 4/1973 | Helin | H02G 3/083 174/66 |
| 4,109,095 | A | * | 8/1978 | Kling | H02G 3/088 174/67 |
| 4,793,818 | A | * | 12/1988 | Poirier | H01R 13/447 174/67 |
| 4,810,833 | A | * | 3/1989 | Meyers | H02G 3/14 174/67 |
| D331,386 | S | * | 12/1992 | Koessler | D13/156 |
| D354,736 | S | * | 1/1995 | Hallett | D13/156 |
| 5,382,755 | A | * | 1/1995 | Correnti | H01R 13/447 174/67 |
| 5,477,010 | A | * | 12/1995 | Buckshaw | H02G 3/14 174/67 |
| 5,675,126 | A | * | 10/1997 | Halvorsen | H01R 13/447 174/67 |
| 6,198,046 | B1 | * | 3/2001 | Moodie | H01R 13/6395 174/67 |

(Continued)

*Primary Examiner* — Xanthia C Cunningham
(74) *Attorney, Agent, or Firm* — Sheppard, Mullin, Richter & Hampton LLP

(57) ABSTRACT

Embodiments disclosed herein include devices and methods for shielding an electrical device. The electrical device shield tool may include an expanding and contracting mechanism; and a body coupled to the expanding and contracting mechanism. The body can include a first half slidably coupled to a second half that are capable of movement, as the body expands to increase an opening with respect to a movement of the expanding and contracting mechanism. Furthermore, the electrical device shield tool can include grooves, that receive protruding edges of the metal enclosure to affix the body to the metal enclosure and form a barrier for the electrical device from the metal enclosure.

19 Claims, 7 Drawing Sheets

(56) References Cited

U.S. PATENT DOCUMENTS

| | | | | |
|---|---|---|---|---|
| 6,309,239 B1 * | 10/2001 | Johnston | H01R 13/447 | 174/67 |
| D460,421 S * | 7/2002 | Marozsan, Jr. | D13/156 | |
| 6,478,587 B2 * | 11/2002 | Sharples | H01R 13/447 | 174/480 |
| 6,545,218 B1 * | 4/2003 | Blaess | H01R 13/4532 | 174/53 |
| 6,552,262 B2 * | 4/2003 | English | H02G 3/14 | 16/221 |
| 6,652,297 B1 * | 11/2003 | Zhang | H01R 13/447 | 361/679.02 |
| 6,699,060 B1 * | 3/2004 | Scott | H01R 13/6395 | 439/373 |
| 6,805,580 B2 * | 10/2004 | Piedmont | H01R 13/447 | 174/66 |
| 7,094,969 B1 * | 8/2006 | In | H02G 3/14 | 174/66 |
| 7,097,474 B1 * | 8/2006 | Naylor | H01R 13/6397 | 174/67 |
| 7,371,105 B1 * | 5/2008 | Allende | H01R 13/6395 | 439/373 |
| 7,414,193 B1 * | 8/2008 | Le | H05K 5/0204 | 174/50 |
| 7,458,479 B1 * | 12/2008 | Thompson | H02G 3/14 | 220/242 |
| 7,528,323 B2 * | 5/2009 | Wu | H01R 13/72 | 174/66 |
| D607,307 S * | 1/2010 | Cutler | D8/353 | |
| 7,654,405 B2 * | 2/2010 | Provenzano | H02G 3/14 | 174/151 |
| 7,674,977 B1 * | 3/2010 | Constantino | H02G 3/14 | 174/53 |
| 7,762,831 B2 * | 7/2010 | Lin | H01R 13/6395 | 439/157 |
| 7,939,757 B1 * | 5/2011 | Baldwin | H02G 3/14 | 174/66 |
| 8,399,765 B1 * | 3/2013 | Baldwin | H02G 3/14 | 174/66 |
| 8,905,229 B1 * | 12/2014 | Lane | A61M 16/06 | 206/207 |
| 8,986,040 B2 * | 3/2015 | Garofalo | H01R 13/6397 | 439/373 |
| 9,065,263 B2 * | 6/2015 | Porcano | H02G 3/14 | |
| 10,014,616 B2 * | 7/2018 | Schutte | H01R 13/447 | |
| 2003/0019652 A1 * | 1/2003 | Shoemaker | H01R 13/4534 | 174/67 |
| 2004/0256134 A1 * | 12/2004 | Jolley | H02G 3/14 | 174/67 |

* cited by examiner

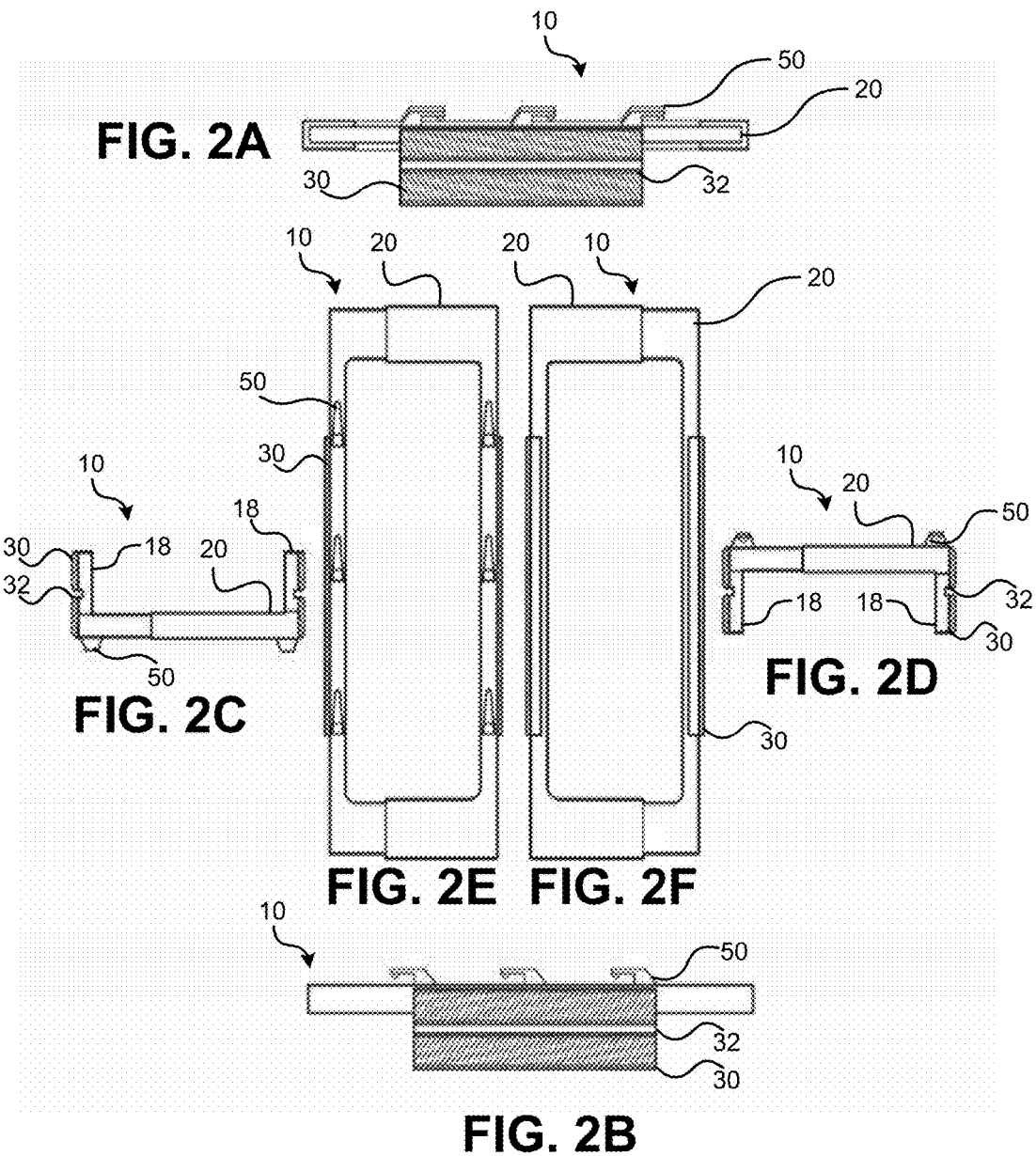

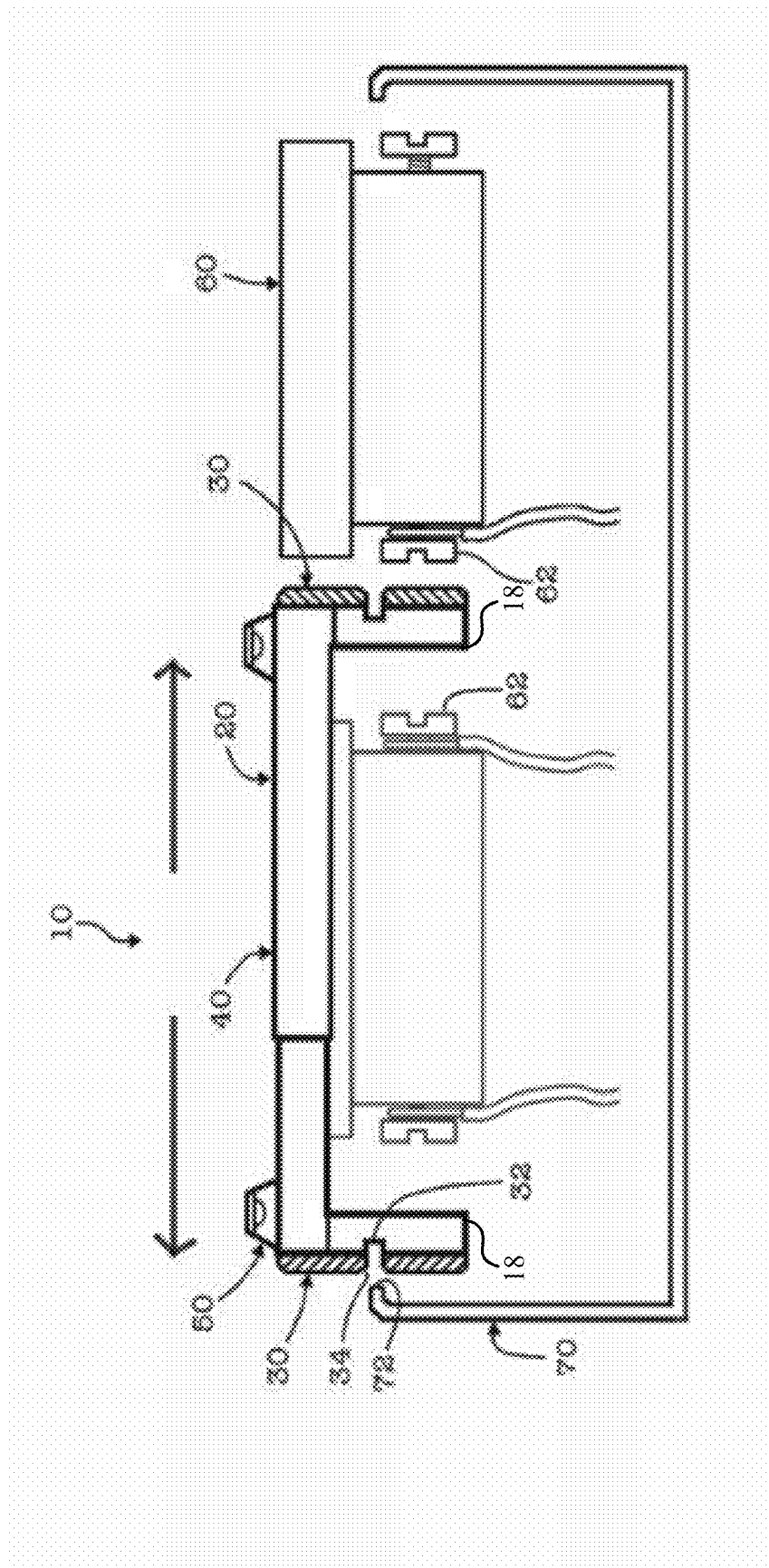

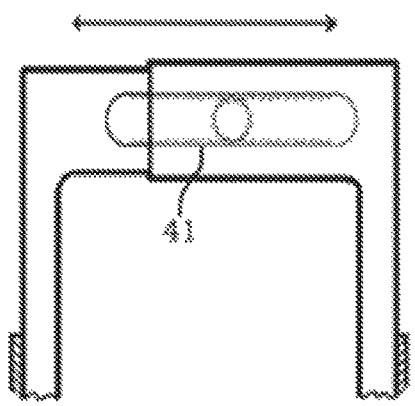
FIG. 5A
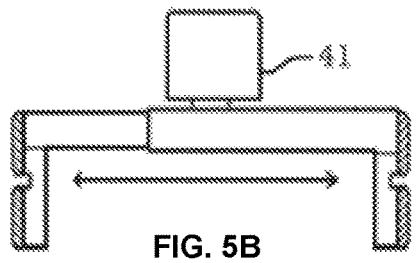
FIG. 5B
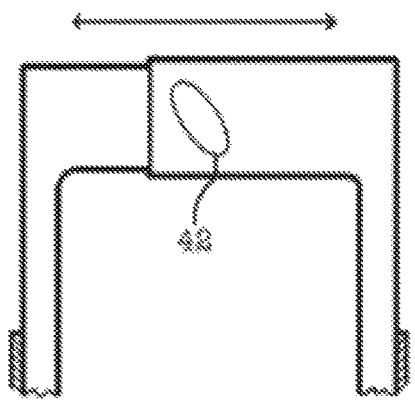
FIG. 5C
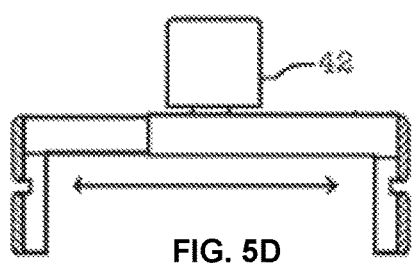
FIG. 5D
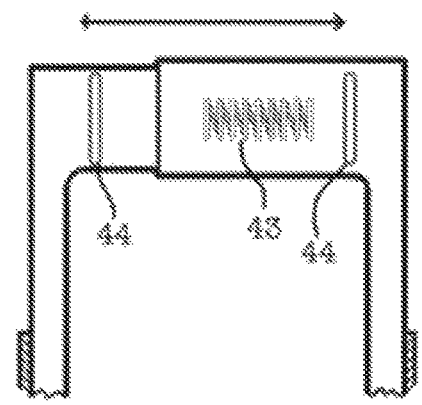
FIG. 5E
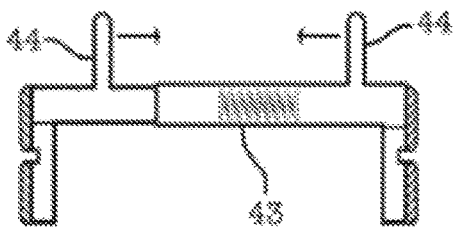
FIG. 5F
FIG. 5

ELECTRICAL DEVICE SHIELD TOOL AND METHOD OF USING SAME

CROSS-REFERENCE TO RELATED APPLICATIONS

This application claims the benefit of U.S. Provisional Patent Application Ser. No. 62/503,863, filed May 9, 2017, and U.S. Provisional Patent Application Ser. No. 62/503,882, filed May 9, 2017. This application hereby incorporates herein by reference, the complete contents of the above referenced United States Provisional Patent Applications, in their entirety.

TECHNICAL FIELD

The disclosed technology relates generally to electrical tools, and more particularly, some embodiments relate to an electrical device shield and methods of using the same.

DESCRIPTION OF THE RELATED ART

Electrical workers are often considered to be engaged in a very dangerous profession. Electrical workers are tasked with working on high voltage, high current electrical circuits. Although electrical workers take many precautions against the risk of shock, accident still occur. Miswiring of the circuit or mislabeling of junction boxes and components can cause an electrician to be exposed to a live circuit even after he or she has taken reasonable steps to turn off the circuit. To exacerbate this problem, electrical workers are often required to manipulate electrical components with their hands or with metal tools. For example, to pull an electrical socket out of a wall box, electricians often use their hands. Consequently, they might accidentally touch the electrical posts carrying electricity to the socket. Furthermore, electrical components, for example wires and terminals, may unintentionally come into contact with other electrical devices, or junction boxes, while the device is being installed in or removed. Accidental contact between conductors can cause various hazardous conditions, such as an arc fault, which is a high-power discharge of electricity that can translate into heat and potentially trigger an electrical fire.

BRIEF SUMMARY OF EMBODIMENTS

According to various embodiments of the disclosed technology, an electrical device shield tool is described. According to one embodiment, the electrical device shield tool may include: an expanding and contracting mechanism; a body coupled to the expanding and contracting mechanism, the body comprising: a first body half slidably coupled to a second body half such that the first body half and the second body half are separable to form an opening along a front surface of the body, wherein the first body half and the second body half move towards each other as the body contracts to reduce the opening and move away from each other as the body expands to increase the opening with respect to a movement of the expanding and contracting mechanism, and grooves, on each of two side surfaces of the body, that receive a respective one of protruding edges of the metal enclosure to affix the body to the metal enclosure and form a barrier for the electrical device to prevent conductive contact of the electrical device while the electrical device is being installed in or removed from the metal enclosure.

Other various embodiments, may include a method for handling an electrical device shield tool. Some embodiments may include: obtaining the electrical device shield tool; inserting the electrical device shield tool over an existing electrical device and a metal enclosure housing the electrical device; expanding a body of the electrical device shield outward with respect to a movement of an expanding and contracting mechanism, such that a first half and a second half of the body are moved away from each other to form a space, wherein the electric device is accessible in the space between the first half and the second half of the body; and inserting one of protruding edges of a metal enclosure into a respective groove on each of two side surfaces of the body to affix the body to the metal enclosure and form a barrier for the electrical device from the metal enclosure.

Other embodiments may include a wire holder device that accepts and holds wires in a secure position, in a manner that reduces the risk of accidental contact.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

Some of the figures included herein illustrate various embodiments of the disclosed technology from different viewing angles. Although the accompanying descriptive text may refer to such views as "top," "front," "back," "bottom" or "side" views, such references are merely descriptive and do not imply or require that the disclosed technology be implemented or used in a particular spatial orientation unless explicitly stated otherwise.

FIGS. 2A-2B are side views of the example electrical device shield tool illustrated in FIG. 1A.

FIGS. 2C-2D are top views of the example electrical device shield tool illustrated in FIG. 1A.

FIGS. 2E-2F are front views of the example electrical device shield tool illustrated in FIG. 1A.

FIG. 3 is a top view of an example electrical device shield tool illustrated in FIG. 1A in engagement with an example electrical device.

FIG. 5A is a front view of an example geared expanding and contracting mechanism for the example electrical device shield illustrated in FIG. 1A, in accordance with one embodiment of the technology described herein.

FIG. 5B is a top view of the example geared expanding and contracting mechanism illustrated in FIG. 5A for the example electrical device shield tool.

FIG. 5C is a front view of an example cam style expanding and contracting mechanism for the example electrical device shield tool illustrated in FIG. 1A, in accordance with one embodiment of the technology described herein.

FIG. 5D is a top view of the example cam style expanding and contracting mechanism illustrated in FIG. 5C for the example electrical device shield tool.

FIG. 5E is a front view of an example spring style expanding and contracting mechanism for the example electrical device shield tool illustrated in FIG. 1A, in accordance with one embodiment of the technology described herein.

FIG. 5F is a top view of the example spring style expanding and contracting mechanism illustrated in FIG. 5E for the example electrical device shield tool.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Embodiments of the technology disclosed herein are directed toward devices and methods for shielding an electrical device for operations such as, for example, removal, installation or handling of the electrical device. Embodiments can be configured to shield various components of an electrical device, for example terminal screws, to prevent accidental contact with a metal enclosure of the electrical device, another neighboring electrical device, or other electrical components.

The tool is dimensioned to align the body over, at least, a part of an electrical device and engage an expanding and contracting mechanism, such as a cam expander, to adjust space between the first body half and second body half so that the electric device is placed in between the first body half and the second body half. Additionally, the tool is constructed with grooves along its side surfaces to affix the tool to a metal enclosure housing the electrical device. Accordingly, the device shield tool can be situated in a place, and remain stable in place while various operations involving the electrical device are completed, for instance removing, repairing, or replacing the electrical device.

The tool may include a body portion and an expanding and contracting mechanism portion. The expanding and contracting mechanism can be implemented according to various embodiments, including, but not limited to: an expanding cam system; a screw down expansion mechanism; a sliding track with teeth; thumb and finger pulls; a friction slide; and other expansion mechanisms.

The body portion may be constructed in two halves that are capable of sliding and mounted relative to one another such that they can be separated from each other to be positioned over the electrical component, and expanded to present a space through the front of the electrical device, between the two halves of the body, that is large enough to allow access to the electrical device for various operations, such as unscrewing and removing the device from the metal enclosure. Furthermore, each of the two halves may be described as having two sections, including: a front member (e.g., the portion comprising a front surface of the tool) that can overlay the enclosure; and a lateral member (e.g., the portion extending from a side of the surface of the tool) that can be inserted down into the enclosure.

Figure 1A:
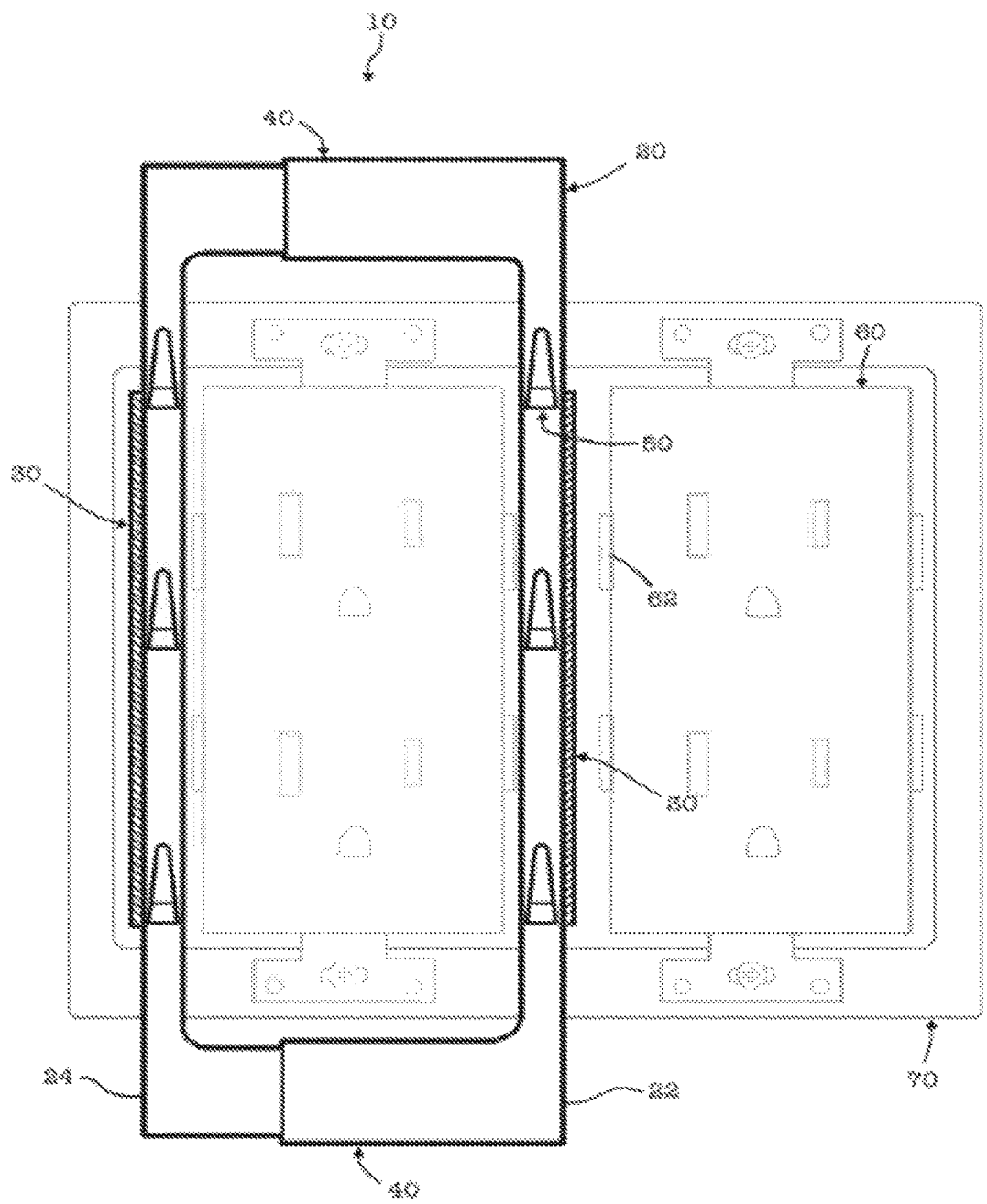
FIG. 1A is a diagram illustrating an example electrical device shield tool in accordance with one embodiment of the technology described herein.

FIG. 1A is a diagram illustrating an example electrical device shield tool 10 in accordance with one embodiment described herein. FIG. 1A shows a front view of the electrical device shield tool 10 in reference to an example arrangement of the tool in operation, hereinafter referred to as the front surface, or face, of the tool. FIGS. 2A-2F are diagrams illustrating multiple views of the example electrical device shield tool 10 shown in FIG. 1A. FIGS. 2A-2B show side views of the tool 10 prominently illustrating the contoured box and/or device gripping surfaces 30 on the sides of the electrical device shield tool 10. FIGS. 2A-2B respectively show an opposite side of the electrical device shield tool 10.

In alternate views of the tool, FIGS. 2C-2D show a top view of the electrical device shield tool 10. In relation to FIG. 1A, which shows the front surface of the electrical device shield tool 10 in operation, FIGS. 2E-2F illustrate opposite sides of this front surface (e.g., without engagement with an example electrical device), respectively. In some embodiments, the electrical device shield tool 10, and its components, is constructed from non-conductive materials, such as plastic, rubber, and the like, allowing the tool 10 to function as a nonconductive protective shield.

With reference now to FIG. 1A and FIGS. 2A-2F, the example electrical device shield tool 10 includes an expandable body cage 20 (hereinafter referred to as body), a contoured box and/or gripping surface 30 including groove 32, and wire holder clips 50. The body 20 is shown as comprising two portions (halves), an inner cage 22 and an outer cage 24 that can be mated with one another, but can be moved to be spaced apart exposing the electrical device 60 an opening. For purposes of discussion, the tool 10 is described as overlaying one electrical device 60 within an enclosure (illustrated as a junction box 70) in an example arrangement shown in FIG. 1A and FIG. 3, for example. However, it is readily recognized that the tool 10 can undertake various configurations while in use.

Figure 1B:
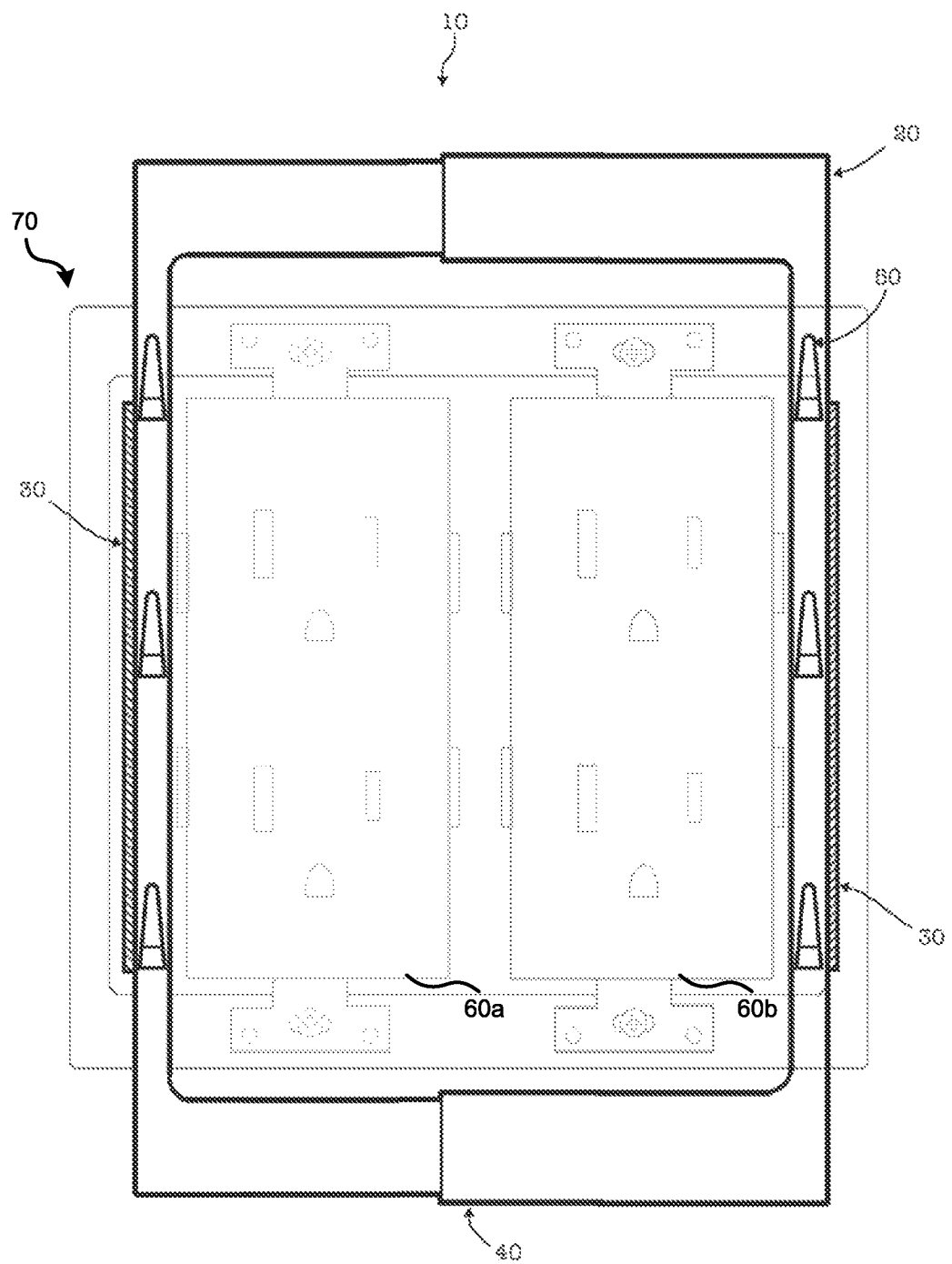
FIG. 1B is a diagram illustrating the example electrical device shield tool in an alternate example arrangement of the tool in operation.

FIG. 1B illustrates the example electrical device shield tool 10 in an alternative example arrangement during operation. In FIG. 1B, the tool 10 is configured such that the body 20 fits over two devices such as in a two-gang junction box 70. According to this example, the body 20 of the tool can be expanded even further along the horizontal axis (e.g., relative to front surface) as compared to the previous illustrated example, for instance as shown in FIG. 1A. As seen in FIG. 1B, due to further expanding the body 20, the tool 10 overlays substantially the entire junction box 70, which includes two electrical devices 60a,60b in this case. This example arrangement of FIG. 1B may be preferable, such as in an instance when all electrical devices 60*a*,60*b* inside of a junction box 70 require removing. Consequently, it should be appreciated that the tool 10 can be adaptively arranged to engage a portion of an electrical device 60*a*, a single electrical device 60*a*, or multiple electrical devices 60*a*,60*b*, to achieve an optimal configuration suited for the tool's 10 application. In further embodiments, an electrical device shield tool 10 can be configured to be expanded for an even greater number of electrical devices.

Referring back to FIG. 1A, the diagram illustrates the electrical device shield tool 10 in engagement with an example electrical device 60. In this example, electrical device 60 can be, for example, an electrical outlet, a receptacle, switch, timer, sensor, etc. In operation, the device shield tool 10 is inserted over an existing electrical device 60, and is expanded outward by an expanding and contracting mechanism 40, such as an expanded cam system. The expanding and contracting mechanism 40 can be constructed using any mechanical means capable of moving, both the front member and/or the lateral member 18 of the halves of the body 20 horizontally (e.g., along the x-axis) with respect to a front surface of the electrical device shield tool 10. Thus, the expanding and contracting mechanism 40 shifts the halves of the body 20 in a manner such that the body 20 can adjust the area of space between the halves of the body 20. FIG. 5C illustrates an embodiment of the example electrical device shield tool 10 including a cam style expanding and contracting mechanism 40, which is the embodiment discussed in referring to FIG. 1A.

The electrical device shield tool 10 includes contoured box and/or device gripping surfaces 30. In the illustrated example, the contoured box and/or device gripping surfaces 30 are disposed on each lateral member 18 of the body halves. The lateral member 18 of a half may be substantially perpendicular to the front member of the corresponding half of the body 20, forming two opposing side surfaces of the tool 10. As the contoured box and/or device gripping surfaces 30 are disposed on the lateral members 18, the surfaces 30 similarly extend outward from the sides of the front surface (e.g., body 20). The contoured box and/or device gripping surfaces 30 of the electrical device shield tool 10 may contact, at least in part, the junction box 70 (which may be metal, plastic or other material). In an example embodiment, seen in FIGS. 2C-2D, the lateral members 18 of the halves, including the contoured box and/or device gripping surfaces 30, extend outwardly from respective front members of the halves of the body 20. Accordingly, the body 20 comprising the front surface of the tool 10, and the contoured box and/or device gripping surfaces 30 situated on both sides thereon, are arranged to form a structure that can be generally described as rectangular shaped for purposes of discussion. However, as illustrated, the electrical device shield tool 10 does not form a closed rectangular structure (e.g., having three outer surfaces as opposed to four). Rather, the electrical device shield tool 10 has an opening in the structure, allowing for the tool 10 to be inserted, in an overlay position, over the electrical device 60. FIG. 1A illustrates that the example electrical device 60 is situated in the open space between the contoured box and/or device gripping surfaces 30 (located on either side of the tool 10).

Further, referring now to FIGS. 2A-2D, each of the contoured box and/or device gripping surfaces 30 include a groove 32 configured to slide around a protruding edge, such as a lip, of an enclosure that houses the electrical device 60. FIG. 1A illustrates a junction box 70 as the enclosure, which houses an electrical device 60 that is engaged by the electrical device shield tool 10. In operation, when the device shield tool 10 is expanded such that the grooves 32 of the electrical device shield tool 10 slide over the two side lips of the junction box 10 (shown in FIGS. 2A-2D), this creates a stable coupling of the electrical device shield tool 10 to the junction box 70. It should be appreciated that although the enclosure is shown as junction box 70 for purposes of illustration, the enclosure can be a raised device ring, or various other embodiments.

Additionally, the contoured box and/or device gripping surfaces 30 may include an insulation layer. A soft rubber or rubber-like material, for example, covers all or portions of the exterior (e.g., outward facing) of the contoured box and/or gripping surfaces 30 on the side of the tool 10. In some instances, the rubber outside layer of the contoured box and/or device gripping surfaces 30 helps the tool 10 grip the sides of the junction box 70. As an example, once the edges of the junction box 70 are inserted into the grooves 32 as the tool 10 is expanded outwards, the rubber of the contoured box and/or device gripping surface 30 may contact portions of the surface of junction box 70, thus causing friction. This friction can result in a gripping effect that further affixes the tool 10 to the junction box 70. Accordingly, the electrical device shield tool 10 is dimensioned to affix to an enclosure for an electrical device in a manner that helps to prevent the shield from coming loose during operation, for example when the electrical device 60 is removed. Although rubber is disclosed for purposes of discussion, in other embodiments the insulation layer can include various insulation materials, for example some rubberlike materials, plastics, foams, polymers, and the like, capable of achieving the same function of gripping the sides of the junction box 70 when the body 20 is extended, in order to hold the tool 10 in place.

As seen in the example of FIG. 1A, the junction box 70 also houses another electrical device 60 that neighbors the electrical device 60 with the electrical device shield tool 10 overlaid thereon. In some cases, the aforementioned rubber layer of the contoured box and/or device gripping surfaces 30 can grip against the screws 62 of the electrical device 60 sitting next to the device being engaged by the tool 10. In other applications, contoured box and or device gripping surfaces 30 can grip against other elements on the side of the neighboring electrical device 60. FIG. 1A illustrates that an electrical device 60 can include several screws 62, which can be used as terminals or for mounting electrical wire to the device 60. To this end, the electrical device shield tool 10 realizes a solution that helps to shield an electrical device 60 with insulation, and thereby reducing the risk of hazards associated with conductive electrical components accidentally contacting each other while exposed (e.g., during various operations such as removal, installation, handling, etc.).

Referring again to FIG. 1A and FIGS. 2A-2F, multiple wire holder clips 50 are shown mounted on the face of the electrical device shield tool 10 in this example. Each of the wire holder clips 50 can be situated at a specific location about the front surface of the tool 10, and configured to receive and securely hold electrical components, for example wires, that may be exposed during operations. As seen in the example embodiment, multiple wire holder clips 50 include a raised tip to prevent slipping of a placed wire, and are arranged along either side of the body 20 along the height of the tool 10. In this example, each side of the body 20 for the tool 10 is shown to have the same number of wire holder clips 50 mounted thereon. However, it should be appreciated that the wire holder clips 50 can be arranged in various locations and having various configurations on the electrical device shield tool 10 as deemed necessary and/or appropriate.

FIG. 3 is a top view of an example electrical device shield tool 10 illustrated in FIG. 1A in engagement with an example electrical device 60. As seen in FIG. 3, the body 20 of the tool 10 includes two halves that are mated with one another, but can be moved in opposing directions (e.g., expanding) illustrated by the arrows. Alternatively, the halves of the body 20 can move in the same direction towards each other (e.g., contracting). FIG. 3 illustrates that moving the expanding and contracting mechanism 40 in an expanding, or opening, motion, in turn, causes movement of the halves of the body 20 away from each other (shown by arrows).

In the embodiment where the expanding and contracting mechanism 40 is a cam expander, a rotation of a handle 42 (illustrated in FIGS. 5C and 5D) can impart a like rotation on the cam. Thus, rotation of expanding and contracting mechanism 40, namely the cam, in one direction causes the halves of body 20 to move toward one another. Alternatively, rotation of cam in the other direction causes the halves of the body 20 to move away from one another, as seen in FIG. 3. For example, rotating the handle 42 to adjust spacing between the first half and second half of the body can include: rotating the handle 42 clockwise to slide the first half away from the second half of the body in order to conform to dimensions of the metal enclosure; and rotating the handle 42 counterclockwise to slide the first half towards the second half of the body to conform to dimensions of the metal enclosure.

The body 20 can be spaced apart in accordance with movements of the expanding and contracting mechanism 40, such that the tools is configured in an open position (e.g., fully expanded or conforming to dimensions of the junction box, or junction box and neighboring electrical device, or two adjacent neighboring electrical devices). The space created between the separated halves of the body 20 is preferably large enough such that the electrical device 60 can be placed in this space while the body 20 is in the open position. In some cases, when the electrical device shield tool 10 is configured in its open position, the space between the halves of the body 20 is large enough to perform various functions on the shielded electrical device 60, such as unscrewing and removing the electrical device 60 from the junction box 70.

Also seen in FIG. 3, is the groove 32 of the electrical device shield tool 10 receiving a protruding edge 72 of the junction box 70. In this example, the contoured box and/or device gripping surfaces 30 include a beveled edge 34 to guide the junction box 70 into the groove 32. The beveled edge 34 can be generally described as a tapered section of the contoured box and/or device gripping surface 30 at the insertion point of the groove 32. After inserting the protruding edge 72, or lip, of the junction box 70 into the groove 32, the electrical device shield tool 10 is stably affixed to the metal junction box 10. FIG. 3 shows that the tool 10, when coupled to the junction box 70, is in a configuration that forms a barrier for the electrical device 60. According to the embodiments, the electrical device shield tool 10 operates to form a protective barrier for the electrical device 60, shielding the device and its components, such as terminal screws 62 and wires, from unintended conductive contact.

Moreover, referring to the example in FIG. 3, although the tool 10 is engaging the electrical device (shown on the left-hand side junction box 70), the contoured box and/or device gripping surface 30 can also provide insulation over the terminal screw 62 of an adjacent electrical device 60 (shown on the right-hand side of the junction box 70). As a result, in operation, the electrical device shield tool 10 can help reduce the risk of shock, arcing, and the like, in the event that power is not turned off for the neighboring electrical device 60.

Figure 4:
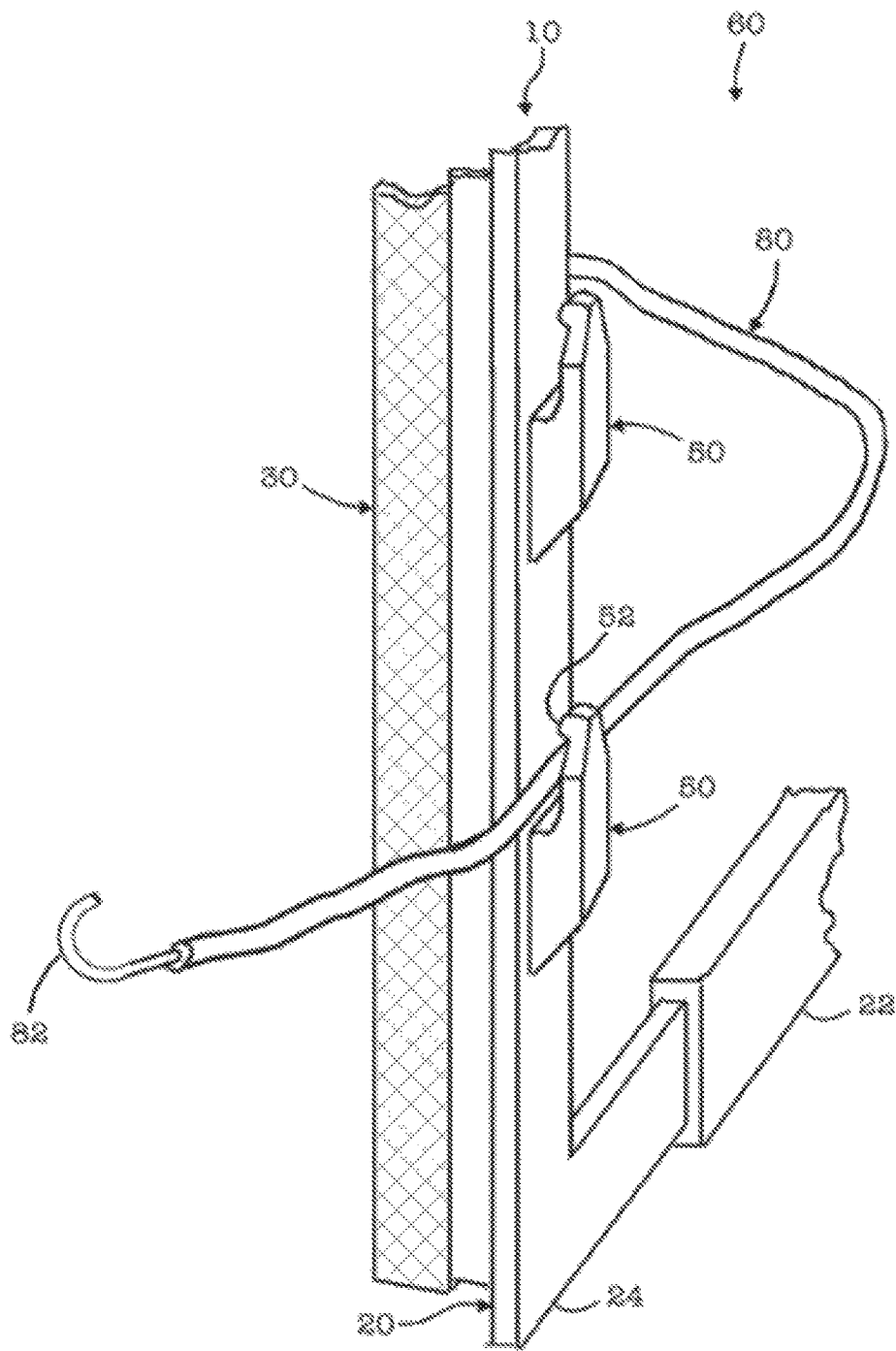
FIG. 4 is a perspective view of one side of the electrical device shield tool illustrated in FIG. 1A including wire holder clips.

FIG. 4 is a perspective view of one side of the electrical device shield tool 10 illustrated in FIG. 1A including wire holder clips 50. As previously discussed in referring to FIG. 1A, the multiple wire holder clips 50 are mounted to the face of the electrical device shield tool 10. The profile view of the holder clips 50 show the raised tip 52 securely holding a wire 80 placed within the space between the tip 52 and the surface of body 20.

As illustrated in FIG. 4, the wire holder clips 50 in this example are configured such that a wire 80 placed in the clip is held in a secure position. In the example, the wire holder clip 50 is configured to hold the wire 80 off towards the outer edge of the tool 10, which is away from the working area, and the opening of the tool 10 where the electrical device 60 is located. Furthermore, the wire holder clip 50 secures the exposed tip 82 of the wire 80 in manner that prevents the tip from making contact with the electrical device 60, for example as the device is being removed or installed.

The raised tip 52 of the wire holder clip 50 can have a beveled, or rounded, ridge to firmly hold the wire 80. In some cases, the beveled edges of the tip 52 increase the ease of removing the wire 80 from the wire holder clips 50. The wire holder clips 50 may be dimensioned to hold wires 80 of various gauges. For example, four, five, or six wire holder clips 50 may be provided, each with a different dimension to accept four, five, or six different gauges of wire, respectively. For example, four clips may be provided to accept 8, 10, 12, and 14 AWG wire. As another example, different sized wire holder clips 50 may be provided in pairs or triplets or in other quantities such that multiple wires of the same gauge can be accepted. As these examples illustrate, other quantities of wire holder clips 50 may be provided and they may be dimensioned based on, for example, anticipated applications. Additionally, in some embodiments wire holder clips 50 may be dimensioned such that a given wire holder clip 50 can accommodate wire of a range of gauges. For example, the internal geometry of wire holder clips 50 may form a V or otherwise have a tapered geometry such that wires of a range of thicknesses can be accepted and held in place by the clip. As another example, the elastomeric properties of wire holder clips 50 may provide sufficient flexibility and resilience to allow the wire holder clips 50 to accept and retain wires of various thicknesses.

It should be appreciated that the wire holder clips 50 illustrated are an example, but alternatively can be implemented using different mechanisms, such as clips, fasteners, hooks, adhesives, and the like, that are capable of holding a wire. For example, the tool 10 can include a wire holder device that comprises a pair of elongated members attached to a hinge, such that jaws formed by the member can be opened and closed to accept and grip one or more electrical wires.

As discussed referring to FIG. 1A, the expanding and contracting mechanism 40 can be implemented using various mechanical means that are capable of causing a slidable movement of the body 20, to expand and contact the electrical device shield tool 10 as desired. FIGS. 5A-5F and FIGS. 6A-6D illustrate various embodiments for the expanding and contracting mechanism 40 for the tool 10.

FIG. 5A is a front view of an example geared expanding and contracting mechanism for the example electrical device shield illustrated in FIG. 1A, in accordance with one embodiment of the technology described herein. FIG. 5B is a top view of the example geared expanding and contracting mechanism illustrated in FIG. 5A for the example electrical device shield tool. FIGS. 5A-5B show a geared and/or ratcheting expander 41.

FIG. 5C is a front view of an example cam style expanding and contracting mechanism for the example electrical device shield tool illustrated in FIG. 1A, in accordance with one embodiment of the technology described herein. Rotating cam style expanding and contracting mechanism includes a handle 42 that can be rotated. FIG. 5D is a top view of the example cam style expanding and contracting mechanism illustrated in FIG. 5C for the example electrical device shield tool. FIGS. 5C-5D show the cam expander handle 42.

FIG. 5E is a front view of an example spring style expanding and contracting mechanism for the example electrical device shield tool illustrated in FIG. 1A, in accordance with one embodiment of the technology described herein. FIG. 5F is a top view of the example spring style expanding and contracting mechanism illustrated in FIG. 5E for the example electrical device shield tool. FIGS. 5E-5F show the spring-loaded expander 43, and the spring loaded expanded contracting handles 44.

Figure 6A:
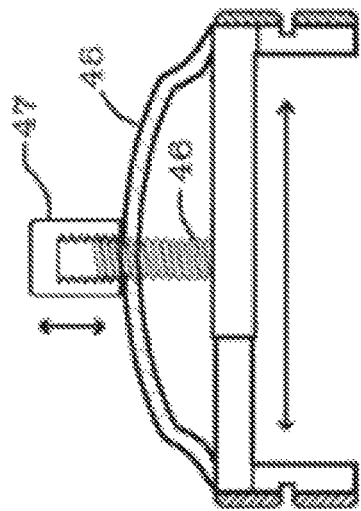
FIG. 6A is a front view of an example screw-down expanding and contracting mechanism for the electrical device shield tool illustrated in FIG. 1A, in accordance with one embodiment of the technology described herein.
Figure 6B:
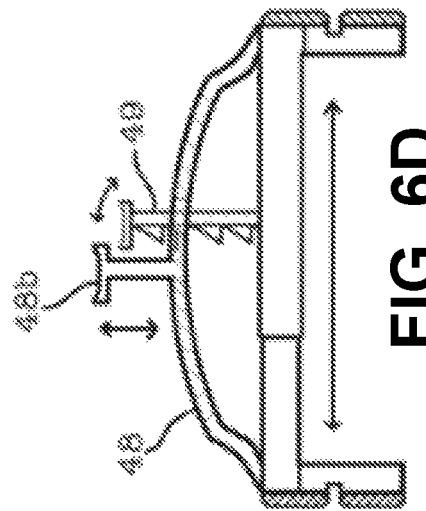
FIG. 6B is a top view of the example screw-down expanding and contracting mechanism illustrated in FIG. 6A for the electrical device shield tool.

FIG. 6A is a front view of an example screw-down expanding and contracting mechanism for the electrical device shield tool illustrated in FIG. 1A, in accordance with one embodiment of the technology described herein. FIG. 6B is a top view of the example screw-down expanding and contracting mechanism illustrated in FIG. 6A for the electrical device shield tool. FIGS. 6A-6B show the screw down expander 45, and the screw-down expander screw 47.

Figure 6C:
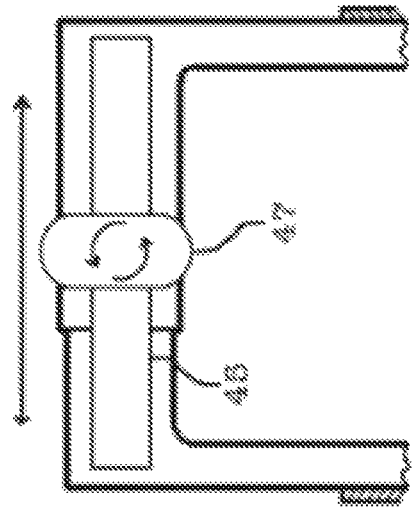
FIG. 6C is a front view of an example push-down expanding and contracting mechanism for the electrical device shield tool illustrated in FIG. 1A, in accordance with one embodiment of the technology described herein.
Figure 6D:
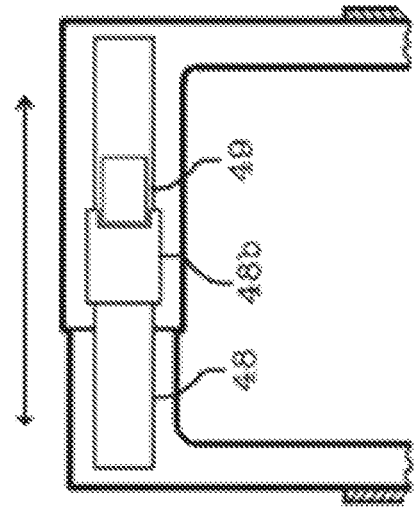
FIG. 6D is a top view of the example push-down expanding and contracting mechanism illustrated in FIG. 6C for the electrical device shield tool.

FIG. 6C is a front view of an example push-down expanding and contracting mechanism for the electrical device shield tool illustrated in FIG. 1A, in accordance with one embodiment of the technology described herein. FIG. 6D is a top view of the example push-down expanding and contracting mechanism illustrated in FIG. 6C for the electrical device shield tool. FIGS. 6C-6D show the push-down expander 48, the push-down expander thumb pad 48b, and the push-down expander toothed locking mechanism 49.

While various embodiments of the disclosed technology have been described above, they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An electrical device shield tool comprising:
an expanding and contracting mechanism; and
a body coupled to the expanding and contracting mechanism, the body comprising a first body half slidably coupled to a second body half such that the first body half and the second body half are separable to form a space a between the first body half and the second body half along a front surface of the body, wherein the first body half comprises a first lateral member and the second body half comprises a second lateral member, the first and second lateral members configured to be inserted between sides of the electrical device and an enclosure in which the electrical device is mounted, and wherein the first and second lateral members move towards each other as the body contracts to reduce the opening and move away from each other as the body expands to increase the opening with respect to a movement of the expanding and contracting mechanism.

2. The electrical device shield tool of claim 1, wherein the body further comprises grooves, on each of two side surfaces of the body, that receive a respective one of protruding edges of a metal enclosure to affix the body to the metal enclosure and form a barrier for the electrical device from the metal enclosure.

3. The electrical device shield tool of claim 2, wherein the barrier prevents conductive contact of the electrical device while the electrical device is being installed in or removed from the metal enclosure.

4. The electrical device shield tool of claim 2, wherein the barrier is demarcated by the front surface of the body, and the side surfaces of the body that are separated latitudinally across a width of the body.

5. The electrical device shield tool of claim 1, wherein the first body half and the second body half move away from each other, with respect to an opening movement of the expanding and contracting mechanism, to an open position configuration.

6. The electrical device shield tool of claim 5, wherein the open position configuration comprises the body expanded such that the electric device is accessible in the space between the first body half and the second body half and the body conforms to dimensions of a metal enclosure.

7. The electrical device shield tool of claim 2, wherein the grooves are configured to receive the protruding edges of the metal enclosure, a protruding edge on each of two opposing surfaces separated by an opening of the metal enclosure.

8. The electrical device shield tool of claim 2, wherein the body comprises insulation material on an exterior of the two side surfaces of the body.

9. The electrical device shield tool of claim 8, wherein the insulation material forms a coupling grip while in contact with the metal enclosure.

10. The electrical device shield tool of claim 8, wherein the insulation material forms an insulated layer while in contact with a terminal of an additional electrical device adjacent to the electrical device.

11. The electrical device shield tool of claim 10, wherein the metal enclosure houses the additional electrical device.

12. The electrical device shield tool of claim 1, further comprising one or more wire holder mechanisms mounted to the front surface of the body, wherein each of the one or more wire holder mechanisms comprise a raised tip to receive and hold wires.

13. The electrical device shield tool of claim 1, wherein the expanding and contracting mechanism comprises at least one of: a geared expander, a cam expander, a spring-loaded expander, a screw-down expander, and a push-down expander.

14. The electrical device shield tool of claim 1, wherein the space between the first body half and the second body half is parallel to a back surface of the metal enclosure housing the electrical device.

15. A method for handling an electrical device shield tool comprising:
    obtaining the electrical device shield tool;
        inserting the electrical device shield tool over an existing electrical device and between sides of the electrical device and a metal enclosure housing the electrical device, forming a barrier for the electrical device from the metal enclosure;
        expanding a body of the electrical device shield outward with respect to a movement of an expanding and contracting mechanism, such that a first half and a second half of the body are moved away from each other to form a space, wherein the electric device is accessible in the space between the first half and the second half of the body; and
        wherein expanding the body of the electrical device shield outward causes a protruding edge of the metal enclosure to slide into a respective groove on a side surface of the body to affix the body to the metal enclosure.

16. The method of claim 15, wherein the expanding and contracting mechanism is a cam expander.

17. The method of claim 15, further comprising rotating a handle of the cam expander to adjust spacing between the first half and second half of the body.

18. The method of claim 16, further comprising rotating the handle of the cam expander clockwise to slide the first half away from the second half of the body in order to conform to dimensions of the metal enclosure.

19. The method of claim 16, further comprising rotating the handle of the cam expander counterclockwise to slide the first half towards the second half of the body to conform to dimensions of the metal enclosure.

* * * * *